(12) United States Patent
Allers et al.

(10) Patent No.: US 8,547,070 B2
(45) Date of Patent: Oct. 1, 2013

(54) METHODS FOR MANUFACTURING AND OPERATING A SEMICONDUCTOR DEVICE

(75) Inventors: Karl-Heinz Allers, Haar (DE); Reiner Schwab, Hausham (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 12/623,489

(22) Filed: Nov. 23, 2009

(65) Prior Publication Data

US 2010/0066313 A1 Mar. 18, 2010

Related U.S. Application Data

(60) Division of application No. 11/408,794, filed on Apr. 21, 2006, now Pat. No. 7,626,222, which is a continuation of application No. PCT/DE2004/002301, filed on Oct. 15, 2004.

(30) Foreign Application Priority Data

Oct. 22, 2003 (DE) .................................. 103 49 557

(51) Int. Cl.
*H02J 7/00* (2006.01)
(52) U.S. Cl.
USPC ............... 320/166; 320/167; 363/60; 363/63
(58) Field of Classification Search
USPC ............................ 320/166–167; 363/63, 60
See application file for complete search history.

(56) References Cited

U.S. PATENT DOCUMENTS

| 4,056,764 | A | * | 11/1977 | Endo et al. ..................... 320/101 |
| 4,691,158 | A | * | 9/1987 | Hashimoto et al. ........... 320/131 |
| 4,897,774 | A | | 1/1990 | Bingham et al. |
| 5,270,913 | A | | 12/1993 | Limpaecher |
| 5,274,586 | A | | 12/1993 | Matsukawa |
| 5,684,386 | A | * | 11/1997 | Okada ............................. 320/139 |
| 5,734,291 | A | * | 3/1998 | Tasdighi et al. ................ 327/537 |
| 6,411,531 | B1 | * | 6/2002 | Nork et al. ........................ 363/60 |
| 6,635,380 | B1 | * | 10/2003 | Shimoda et al. ................. 429/93 |
| 2001/0015449 | A1 | | 8/2001 | Nguyen et al. |
| 2003/0057987 | A1 | | 3/2003 | Ohlhoff et al. |

FOREIGN PATENT DOCUMENTS

| DE | 200 13 501 U1 | 1/2001 |
| DE | 101 45 021 C1 | 4/2003 |

* cited by examiner

*Primary Examiner* — Samuel Berhanu
(74) *Attorney, Agent, or Firm* — Slater & Matsil, L.L.P.

(57) ABSTRACT

A method for manufacturing and operating a semiconductor device is disclosed. The semiconductor device includes a first capacitor node, a second capacitor node, a first capacitor electrode, a second capacitor electrode, a first switch and a second switch. The first switch is coupled between the first capacitor electrode and the first and second capacitor nodes such that the first switch has a first position that couples the first capacitor electrode to the first capacitor node and a second position that couples the first capacitor electrode to the second capacitor node. The second switch is coupled between the second capacitor electrode and the first and second capacitor nodes such that the second switch has a first position that couples the second capacitor electrode to the first capacitor node and a second position that couples the second capacitor electrode to the second capacitor node.

18 Claims, 1 Drawing Sheet

METHODS FOR MANUFACTURING AND OPERATING A SEMICONDUCTOR DEVICE

This application is a divisional application of U.S. application Ser. No. 11/408,794, entitled "Capacitor Arrangement in a Semiconductor Component and Driving Apparatus" filed Apr. 21, 2006 now U.S. Pat. No. 7,626,222. U.S. application Ser. No. 11/408,794 is a continuation of International Application No. PCT/DE2004/002301, filed Oct. 15, 2004, which designated the U.S. and was not published in English, and which is based on German Application No. 103 49 557.6 filed Oct. 22, 2003. All above-cited prior applications are incorporated herein by reference.

TECHNICAL FIELD

The invention relates to a capacitor arrangement in a semiconductor component having a first capacitor electrode, a second capacitor electrode and a dielectric that is surrounded by the capacitor electrodes. It is possible to apply a capacitor voltage to the capacitor electrodes.

BACKGROUND

The invention also relates to a method for driving a capacitor in a semiconductor component, a capacitor voltage being applied to the capacitor electrodes.

Capacitors constitute basic components of semiconductor technology and may undertake various functions within a semiconductor component. In this case, two different operating modes, unipolar operation and bipolar operation, are essentially considered. In this case, unipolar operation is understood as meaning that a voltage having the same polarity but not necessarily the same amplitude is applied to the capacitor. Applying a DC voltage that has the same polarity and the same amplitude is thus a special form of unipolar operation. Bipolar operation is understood as meaning that a voltage having alternating polarity is applied.

Depending on the operating mode, capacitors that are operated in a unipolar manner are used, for example, to protect against current spikes within the semiconductor component, and bipolar capacitors are used to filter signals.

It is known that integrated capacitors have a limited lifetime which, in addition to various operating parameters such as temperature and the applied voltage, is directly associated with the thickness of the dielectric used.

It has been proven using experiments that particular dielectrics used in the semiconductor region have a longer lifetime during bipolar operation than during unipolar operation. Either a higher thickness of the dielectric or else a shorter lifetime must, therefore, be accepted for capacitors that are operated in a unipolar manner.

SUMMARY OF THE INVENTION

Therefore, the invention is based on the object of providing a circuit arrangement and a method for driving a capacitor, which avoids the disadvantages of a capacitor that is operated in a unipolar manner.

The object on which the invention is based is achieved by means of a capacitor circuit arrangement by virtue of the fact that a changeover arrangement having a first input and a second input and a first output and a second output is provided. In this case, in order to externally connect the capacitor, the first input constitutes the terminal for the first capacitor electrode and the second input constitutes the terminal for the second capacitor electrode. The changeover arrangement has two outputs that are designed in such a manner that the first output is connected to the first capacitor electrode and the second output is connected to the second capacitor electrode. In a first switch position in the changeover arrangement, the first input is connected to the first output and the second input is connected to the second output and, in a second switch position, the first input is connected to the second output and the second input is connected to the first output. This capacitor circuit arrangement makes it possible to change the polarity at the capacitor electrodes.

In one expedient refinement of the invention, the changeover arrangement has a control input, which is connected to a control signal generator, which thus enables a changeover operation that can be electronically switched from the outside.

The object on which the invention is based is also achieved by means of a driving method that drives the capacitor circuit arrangement in such a manner that the capacitor voltage is applied, with alternating polarity, during an overall period of time in such a manner that it is applied with a first polarity during first periods of time and with a second polarity that is opposite to the first polarity during second periods of time.

BRIEF DESCRIPTION OF THE DRAWINGS

The invention shall be explained in more detail below with reference to two exemplary embodiments. In the associated drawings.

Figure 1:
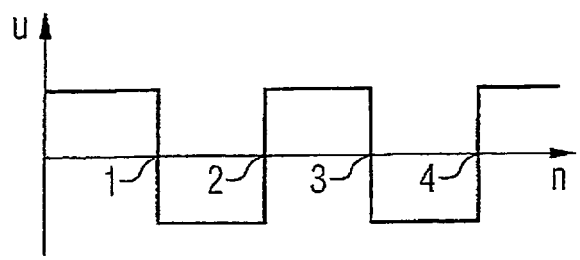
FIG. 1 shows an inventive distribution of the polarity of the capacitor voltage.

The following list of reference symbols can be used in conjunction with the figures:
1 Capacitor
2 Changeover arrangement
3 First input
4 Second input
5 First switch
6 Second switch
7 Control line
8 First output
9 Second output
N Event

DETAILED DESCRIPTION OF ILLUSTRATIVE EMBODIMENTS

As illustrated in the drawings, the polarity at the capacitor 1 changes as a result of a regular event N, which can be selected depending on the application. The event N is formed by applying the operating voltage to the semiconductor component or by an internally generated clock.

In this exemplary embodiment, the capacitor comprises two TiN electrodes and an SiN dielectric, which is surrounded by the electrodes.

Figure 3:
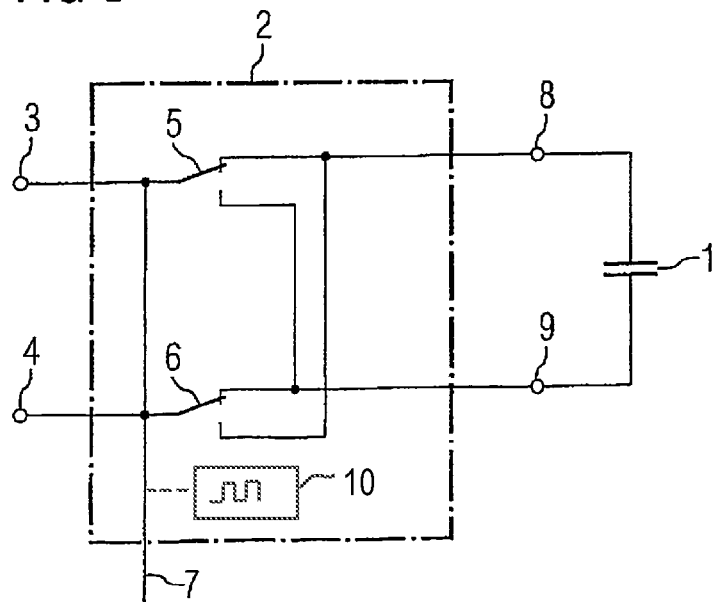
FIG. 3 shows a capacitor circuit arrangement according to the invention.

FIG. 3 illustrates a changeover arrangement 2 that is implemented using conventional components and is intended to reverse the polarity at the capacitor 1. The capacitor circuit arrangement includes a first input 3 and a second input 4 as well as a changeover arrangement 2 that contains a first switch 5 and a second switch 6. Both switches can be electronically controlled using a control line 7. A clock signal generating device 10 may be in connection with the control line 7. The changeover arrangement 2 has a first output 8 and a second output 9 which equally constitute the inputs of the capacitor 1.

Figure 2:
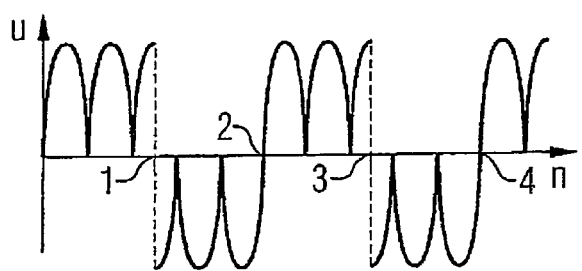
FIG. 2 shows an inventive distribution of the polarity of the capacitor voltage as a pulsating DC voltage.

If a control signal that is triggered by an event N is applied to the control line 7, the switches 5 and 6 are operated and the connections between the first input 3 and the first output 8 and between the second input 4 and the second output 9 are mutually interchanged. Depending on the signal applied and on the basis of the event N, capacitor voltage profiles as illustrated in FIG. 1 or FIG. 2 thus result.

The effect achieved in this case is that it becomes possible to now operate a capacitor, which has previously been operated in a purely unipolar manner, in a bipolar manner using a change in polarity and thus to significantly extend the lifetime of the capacitor.

In order to make optimum use of the effect to extend the lifetime of the capacitor, the stress levels of both polarities should compensate for each other.

For applications in which the capacitor is operated using a DC voltage, it is, therefore, necessary for the cumulated time during which the capacitor is operated with the first polarity to be approximately equal to the cumulated time during which the capacitor is operated with the second polarity. This type of application is preferred for use of the invention.

For applications in which the capacitor is operated using a voltage that varies over time, the time integral from the product of time and a suitable function of the voltage must be approximately compensated for with both polarities.

In order to carry out the method according to the invention, the originally applied capacitor voltage may be both a constant DC voltage and/or a pulsating DC voltage. The method can thus be applied to all capacitors that are operated in a unipolar manner.

In order to achieve the desired effect, the first and second periods of time may be seconds to weeks.

In another variant of the method according to the invention, the changeover arrangement is driven using a control signal. This has the advantage of possible automation of the changes in polarity of the capacitor voltage. It is possible to use the application of the operating voltage to the semiconductor component as the control signal. It is also possible to use an internally generated clock as the control signal. The advantage of one of these two embodiments of the method is that the polarity of the capacitor voltage is changed over in a completely automatic manner.

The considerable extension of the lifetime of the capacitor, which is achieved by means of the invention, can be used to increase the reliability and lifetime of the capacitor and thus of the overall semiconductor component. On the other hand, it is possible to reduce the thickness of the dielectric, which is required for a desired lifetime, and thus to reduce the space required by the capacitor in the semiconductor component.

What is claimed is:

1. A method for driving a capacitor in a semiconductor component, the method comprising:
   (a) generating a first voltage between a first node and a second node;
   (b) for a first period of time, applying the first voltage to the capacitor by coupling a first capacitor electrode to the first node and coupling a second capacitor electrode to the second node, such that a voltage difference between the first and second capacitor electrodes is the first voltage;
   (c) for a second period of time after the first period of time, applying the first voltage to the capacitor by coupling the first capacitor electrode to the second node and coupling the second capacitor electrode to the first node, such that the voltage difference between the first and second capacitor electrodes is the first voltage, wherein a first switch couples the first node to the first capacitor electrode in a first position and to the second capacitor electrode in a second position, wherein the first period of time and the second period of time are each less than ten seconds; and
   (d) automatically repeating steps (b) and (c).

2. The method as claimed in claim 1, wherein generating the first voltage comprises generating a pulsating DC voltage.

3. The method as claimed in claim 1, wherein a first length of the first period of time and a second length of the second period of time are controlled by a control signal.

4. The method as claimed in claim 3, wherein the control signal is generated whenever an operating voltage is applied to the semiconductor component.

5. The method as claimed in claim 3, wherein the control signal is generated from an internal clock in the semiconductor component.

6. The method as claimed in claim 1, wherein generating the first voltage comprises generating the first voltage wherein a potential at the first node is always greater than or equal to a potential at the second node.

7. The method as claimed in claim 6, wherein generating the first voltage comprises generating a DC voltage.

8. The method as claimed in claim 1, further comprising a second switch, wherein the second switch couples the second node to the first capacitor electrode in a third position and the to the second capacitor electrode in a fourth position, wherein the second switch is in the third position when the first switch is in the first position and wherein the second switch is in the fourth position when the first switch is in the second position.

9. The method as claimed in claim 1, wherein a sum of the first periods of time and a sum of the second periods of time are approximately the same.

10. A method for driving a capacitor in a semiconductor component, the method comprising:
    (a) generating a first voltage between a first node and a second node;
    (b) for a first period of time, applying the first voltage to the capacitor by coupling a first capacitor electrode to the first node and coupling a second capacitor electrode to the second node, such that a voltage difference between the first and second capacitor electrodes is the first voltage;
    (c) for a second period of time after the first period of time, applying the first voltage to the capacitor by coupling the first capacitor electrode to the second node and coupling the second capacitor electrode to the first node, such that the voltage difference between the first and second capacitor electrodes is the first voltage, wherein a first switch couples the first node to the first capacitor electrode in a first position and to the second capacitor electrode in a second position, wherein the first period of time and the second period of time are each less than ten seconds; and
    (d) directly transitioning between steps (b) and (c), and between steps (c) and (b).

11. The method as claimed in claim 10, wherein generating the first voltage comprises generating a pulsating DC voltage.

12. The method as claimed in claim 10, wherein a first length of the first period of time and a second length of the second period of time are controlled by a control signal.

13. The method as claimed in claim 12, wherein the control signal is generated whenever an operating voltage is applied to the semiconductor component.

14. The method as claimed in claim 12, wherein the control signal is generated from an internal clock in the semiconductor component.

15. The method as claimed in claim 10, wherein generating the first voltage comprises generating the first voltage wherein a potential at the first node is always greater than or equal to a potential at the second node.

16. The method as claimed in claim 15, wherein generating the first voltage comprises generating a DC voltage.

17. The method as claimed in claim 10, further comprising a second switch, wherein the second switch couples the second node to the first capacitor electrode in a third position and the to the second capacitor electrode in a fourth position, wherein the second switch is in the third position when the first switch is in the first position and wherein the second switch is in the fourth position when the first switch is in the second position.

18. The method as claimed in claim 10, wherein a magnitude of time integrals of a voltage function of the first periods of time and a magnitude of time integrals of a voltage function of the second periods of time are approximately a same.

* * * * *

UNITED STATES PATENT AND TRADEMARK OFFICE
CERTIFICATE OF CORRECTION

PATENT NO. : 8,547,070 B2
APPLICATION NO. : 12/623489
DATED : October 1, 2013
INVENTOR(S) : Karl-Heinz Allers Page 1 of 1

It is certified that error appears in the above-identified patent and that said Letters Patent is hereby corrected as shown below:

In the Claims:

In Col. 4, line 29, claim 8, delete "and the" and insert --and--.
In Col. 5, line 13, claim 17, delete "the to the" and insert --to the--.

Signed and Sealed this
Seventh Day of January, 2014

Margaret A. Focarino
*Commissioner for Patents of the United States Patent and Trademark Office*